United States Patent
Gong et al.

(10) Patent No.: US 12,489,419 B2
(45) Date of Patent: Dec. 2, 2025

(54) RESONATOR AND ELECTRONIC DEVICE

(71) Applicant: SPECTRON (SHENZHEN) TECHNOLOGIES CO., LTD, Guangdong (CN)

(72) Inventors: Songbin Gong, Shenzhen (CN); Gabriel Vidal-Alvarez, Shenzhen (CN)

(73) Assignee: SPECTRON (SHENZHEN) TECHNOLOGIES CO., LTD, Guangdong (CN)

( * ) Notice: Subject to any disclaimer, the term of this patent is extended or adjusted under 35 U.S.C. 154(b) by 974 days.

(21) Appl. No.: 17/665,210

(22) Filed: Feb. 4, 2022

(65) Prior Publication Data
US 2022/0255530 A1    Aug. 11, 2022

(30) Foreign Application Priority Data
Feb. 9, 2021    (CN) ......................... 202110175096.5

(51) Int. Cl.
*H03H 9/17* (2006.01)
*H03H 9/02* (2006.01)
*H03H 9/13* (2006.01)

(52) U.S. Cl.
CPC ........ *H03H 9/172* (2013.01); *H03H 9/02102* (2013.01); *H03H 9/131* (2013.01)

(58) Field of Classification Search
CPC ..... H03H 9/172; H03H 9/131; H03H 9/02102
See application file for complete search history.

(56) References Cited

U.S. PATENT DOCUMENTS

| | | | |
|---|---|---|---|
| 8,512,800 B2 | 8/2013 | Godshalk et al. | |
| 9,219,466 B2 | 12/2015 | Meltaus et al. | |
| 2007/0120625 A1* | 5/2007 | Larson, III ............. | H03H 9/587 333/189 |
| 2013/0147320 A1 | 6/2013 | Son et al. | |
| 2014/0117815 A1 | 5/2014 | Bi et al. | |
| 2014/0159548 A1 | 6/2014 | Burak et al. | |

(Continued)

FOREIGN PATENT DOCUMENTS

| | | |
|---|---|---|
| CN | 102904546 A | 1/2013 |
| CN | 104124938 A | 10/2014 |

(Continued)

OTHER PUBLICATIONS

First Office Action issued for Chinese Patent Application No. 202110175096.5, dated Aug. 19, 2022, 17 pages Including English machine translation.

(Continued)

*Primary Examiner* — Bryan P Gordon
(74) *Attorney, Agent, or Firm* — HSML P.C.

(57) ABSTRACT

The present application relates to a resonator and an electronic device. A high and low acoustic impedance alternating layer, a bottom temperature coefficient of frequency compensation layer, a bottom electrode layer, a piezoelectric layer, a top electrode layer and a top temperature coefficient of frequency compensation layer are sequentially stacked on a substrate by using a specific microfabrication process, to form a new resonator. The resonator can simultaneously show excellent characteristics of low loss, wide bandwidth, low temperature sensitivity and a small size through the special stack geometry, thereby having better operation reliability.

17 Claims, 6 Drawing Sheets

(56) References Cited

U.S. PATENT DOCUMENTS

| | | |
|---|---|---|
| 2015/0094000 A1 | 4/2015 | Aigner et al. |
| 2015/0295556 A1* | 10/2015 | Jacobsen ............... H03H 9/175 29/25.35 |
| 2019/0181830 A1 | 6/2019 | Xu et al. |
| 2019/0386641 A1 | 12/2019 | Lee et al. |

FOREIGN PATENT DOCUMENTS

| | | |
|---|---|---|
| CN | 107317560 A | 11/2017 |
| CN | 110061713 A | 7/2019 |
| CN | 110868171 A | 3/2020 |
| EP | 2892153 B1 | 8/2020 |
| JP | 2013-128267 A | 6/2013 |
| JP | 2014030136 A | 2/2014 |
| JP | 2017152868 A | 8/2017 |
| JP | 2018-535595 A | 11/2018 |
| JP | 2020-027987 A | 2/2020 |
| JP | 2020-141337 A | 9/2020 |

OTHER PUBLICATIONS

Second Office Action issued for Chinese Patent Application No. 202110175096.5, dated Mar. 8, 2023, 12 pages including English machine translation.

Notice of Allowance issued for Chinese Patent Application No. 202110175096.5, dated Jul. 16, 2023, 11 pages including English machine translation.

Notice of Reasons for Refusal issued in Japanese Patent Application No. 2023-548294, Jun. 4, 2024, with English translation (9 pages).

Extended European Search Report issued for European Patent Application No. 21925337.4, dated Feb. 14, 2025, 10 pages.

Notice of Allowance issued for Japanese Patent Application No. 2023-548294, Dispatch date: Feb. 18, 2025, 2 pages.

* cited by examiner

RESONATOR AND ELECTRONIC DEVICE

CROSS REFERENCE TO RELATED APPLICATIONS

This application claims priority under 35 U.S.C. § 119 to Chinese Patent Application No. 2021101750965, filed on Feb. 9, 2021, the entire content of which is incorporated herein in its entirety.

TECHNICAL FIELD

The present application relates to the field of semiconductor technologies, and more particularly, to a resonator and an electronic device.

BACKGROUND

In high-end radio-frequency front-end modules, acoustic devices are used to synthesize devices with filtering functions of low loss and sharp roll-off characteristics. Such devices are based on microfabricated structures manufactured by semiconductor technologies. These devices use acoustic vibration to synthesize resonator functions equivalent to cascaded inductors and capacitors. Such devices are generally referred to as surface acoustic wave (SAW) devices or bulk acoustic wave (BAW) devices, and can achieve an extremely high quality factor Q (which directly related to low loss) at very small external dimensions while being compatible with modern electronic components, which thus becomes a mainstream solution for radio-frequency filtering in high-end front-end modules. In particular, the BAW devices are more widely used in high-frequency filtering technologies of high-end front-end modules due to their superior properties over the SAW devices with low loss at high frequencies above 2.5 GHz.

In a conventional BAW device, a piezoelectric film layer is sandwiched between a metallic electrode and other film layers to reduce temperature sensitivity of the device. The BAW device mainly includes two types of structures: one is based on suspended films, and the other is fixed to a film having a reflective stacked substrate. In either cases, a resonant frequency of an acoustic device is set by an overall thickness of a piezoelectric layer and other films contacting it. A new 5G standard requires operation at higher frequencies (above 3 GHz) and over larger bandwidths. Achieving high frequencies presents new challenges for the BAW devices. The BAW devices are required to utilize extremely thin film layers or sacrifice bandwidth. In the conventional BAW device, an inevitable compromise or trade-off exists between the two properties, which may result in limited yields, higher costs, or greater challenges in manufacturing and integrating passive components within acoustic packaging. Such passive components are typically used to compensate for limitations of acoustic devices, but for 5G standards, they are not enough to do so because their properties are stretched and result in additional losses.

SUMMARY

Based on the above, regarding the above problems, it is necessary to provide a resonator and an electronic device.

A resonator is provided, including: a high and low acoustic impedance alternating layer, a bottom temperature coefficient of frequency compensation layer, a bottom electrode layer, a piezoelectric layer, a top electrode layer and a top temperature coefficient of frequency compensation layer. The high and low acoustic impedance alternating layer is arranged on a substrate; the bottom temperature coefficient of frequency compensation layer is arranged on a first surface of the high and low acoustic impedance alternating layer, a surface of the high and low acoustic impedance alternating layer in contact with the substrate is a second surface of the high and low acoustic impedance alternating layer, and the first surface of the high and low acoustic impedance alternating layer is arranged opposite to the second surface of the high and low acoustic impedance alternating layer; the bottom electrode layer is arranged on a first surface of the bottom temperature coefficient of frequency compensation layer, a surface of the bottom temperature coefficient of frequency compensation layer in contact with the high and low acoustic impedance alternating layer is a second surface of the bottom temperature coefficient of frequency compensation layer, and the first surface of the bottom temperature coefficient of frequency compensation layer is arranged opposite to the second surface of the bottom temperature coefficient of frequency compensation layer; the piezoelectric layer is arranged on a first surface of the bottom electrode layer, a surface of the bottom electrode layer in contact with the bottom temperature coefficient of frequency compensation layer is a second surface of the bottom electrode layer, and the first surface of the bottom electrode layer is arranged opposite to the second surface of the bottom electrode layer; the top electrode layer is arranged on a first surface of the piezoelectric layer, a surface of the piezoelectric layer in contact with the bottom electrode layer is a second surface of the piezoelectric layer, and the first surface of the piezoelectric layer is arranged opposite to the second surface of the piezoelectric layer; and the top temperature coefficient of frequency compensation layer is arranged on a first surface of the top electrode layer, a surface of the top electrode layer in contact with the piezoelectric layer is a second surface of the top electrode layer, the first surface of the top electrode layer is arranged opposite to the second surface of the top electrode layer.

In one embodiment, the high and low acoustic impedance alternating layer includes a high acoustic impedance layer and a low acoustic impedance layer, acoustic impedance of the high acoustic impedance layer is higher than that of the low acoustic impedance layer, the high acoustic impedance layer and the low acoustic impedance layer are stacked alternately, a layer in contact with the substrate in the high and low acoustic impedance alternating layer is the low acoustic impedance layer, and a layer in contact with the bottom temperature coefficient of frequency compensation layer in the high and low acoustic impedance alternating layer is the high acoustic impedance layer.

In one embodiment, thicknesses of the high acoustic impedance layer and the low acoustic impedance layer are not exactly same.

In one embodiment, thicknesses of the high acoustic impedance layer and the low acoustic impedance layer are same.

In one embodiment, the resonator further includes an additional layer, the additional layer is arranged on a first surface of the top temperature coefficient of frequency compensation layer, a surface of the top temperature coefficient of frequency compensation layer in contact with the top electrode layer is a second surface of the top temperature coefficient of frequency compensation layer, and the first surface of the top temperature coefficient of frequency compensation layer is arranged opposite to the second surface of the top temperature coefficient of frequency compensation layer.

In one embodiment, the resonator further includes a metal layer, the metal layer is arranged on the first surface of the top electrode layer, the top temperature coefficient of frequency compensation layer is arranged on a first surface of the metal layer, a surface of the metal layer in contact with the top electrode layer is a second surface of the metal layer, and the first surface of the metal layer is arranged opposite to the second surface of the metal layer.

In one embodiment, projections of the bottom electrode layer and the top electrode layer in a direction perpendicular to the substrate are all polygons.

In one embodiment, the high and low acoustic impedance alternating layer, the bottom temperature coefficient of frequency compensation layer, the bottom electrode layer, the piezoelectric layer, the top electrode layer and the top temperature coefficient of frequency compensation layer have a same length in a same direction parallel to the substrate.

In one embodiment, the high and low acoustic impedance alternating layer, the bottom temperature coefficient of frequency compensation layer, the bottom electrode layer, the piezoelectric layer, the top electrode layer and the top temperature coefficient of frequency compensation layer are not exactly the same in length in a same direction parallel to the substrate.

An electronic device, including the resonator described above.

According to the resonator and the electronic device mentioned above, the high and low acoustic impedance alternating layer, the bottom temperature coefficient of frequency compensation layer, the bottom electrode layer, the piezoelectric layer, the top electrode layer and a top temperature coefficient of frequency compensation layer are sequentially stacked on the substrate by using a specific microfabrication process, to form a new resonator. The resonator can simultaneously show excellent characteristics of low loss, wide bandwidth, low temperature sensitivity and a small size through the special stack geometry, thereby having better operation reliability.

BRIEF DESCRIPTION OF THE DRAWINGS

In order to illustrate the technical solutions in embodiments of the present application or the conventional art more clearly, accompanying drawings to be used in the descriptions of the embodiments or the conventional art are briefly introduced below. Apparently, the accompanying drawings in the following descriptions are merely some embodiments of the present application. Those of ordinary skill in the art may also obtain other accompanying drawings according to the provided accompanying drawings without creative efforts.

DETAILED DESCRIPTION OF THE EMBODIMENTS

For easy understanding of the present application, a more comprehensive description of the present application is given below with reference to the accompanying drawings. Preferred embodiments of the present application are given in the accompanying drawings. However, the present application may be implemented in many different forms and is not limited to the embodiments described herein. On the contrary, these embodiments are provided to understand the disclosed content of the present application more thoroughly and comprehensively.

Figure 1:
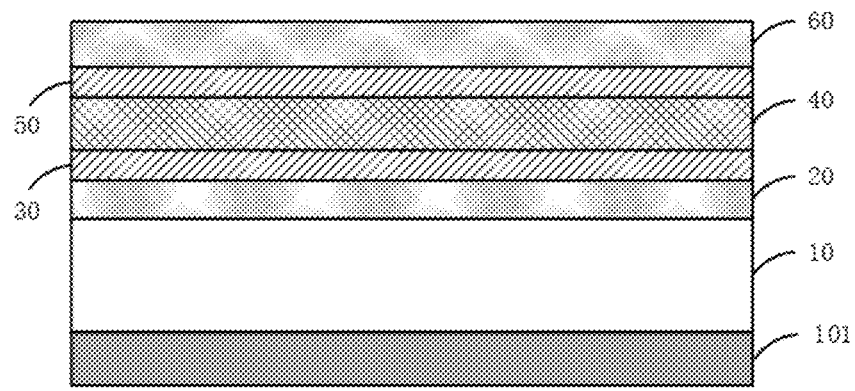
FIG. 1 is a schematic diagram of a sectional structure of a resonator according to an embodiment.

Referring to FIG. 1, a resonator includes: a high and low acoustic impedance alternating layer 10, a bottom temperature coefficient of frequency compensation layer 20, a bottom electrode layer 30, a piezoelectric layer 40, a top electrode layer 50 and a top temperature coefficient of frequency compensation layer 60. The high and low acoustic impedance alternating layer 10 is arranged on a substrate 101; the bottom temperature coefficient of frequency compensation layer 20 is arranged on a first surface of the high and low acoustic impedance alternating layer 10, a surface of the high and low acoustic impedance alternating layer 10 in contact with the substrate 101 is a second surface of the high and low acoustic impedance alternating layer 10, and the first surface of the high and low acoustic impedance alternating layer 10 is arranged opposite to the second surface of the high and low acoustic impedance alternating layer 10; the bottom electrode layer 30 is arranged on a first surface of the bottom temperature coefficient of frequency compensation layer 20, a surface of the bottom temperature coefficient of frequency compensation layer 20 in contact with the high and low acoustic impedance alternating layer 10 is a second surface of the bottom temperature coefficient of frequency compensation layer 20, and the first surface of the bottom temperature coefficient of frequency compensation layer 20 is arranged opposite to the second surface of the bottom temperature coefficient of frequency compensation layer 20; the piezoelectric layer 40 is arranged on a first surface of the bottom electrode layer 30, a surface of the bottom electrode layer 30 in contact with the bottom temperature coefficient of frequency compensation layer 20 is a second surface of the bottom electrode layer 30, the first surface of the bottom electrode layer 30 is arranged opposite to the second surface of the bottom electrode layer 30; the top electrode layer 50 is arranged on a first surface of the piezoelectric layer 40, a surface of the piezoelectric layer 40 in contact with the bottom electrode layer 30 is a second surface of the piezoelectric layer 40, and the first surface of the piezoelectric layer 40 is arranged opposite to the second surface of the piezoelectric layer 40; and the top temperature coefficient of frequency compensation layer 60 is arranged on a first surface of the top electrode layer 50, a surface of the top electrode layer 50 in contact with the piezoelectric layer 40 is a second surface of the top electrode layer 50, and the first surface of the top electrode layer 50 is arranged opposite to the second surface of the top electrode layer 50. As one of the possible implementations, all of the above layers in the resonator are of a same thickness and are unpatterned.

Figure 2:
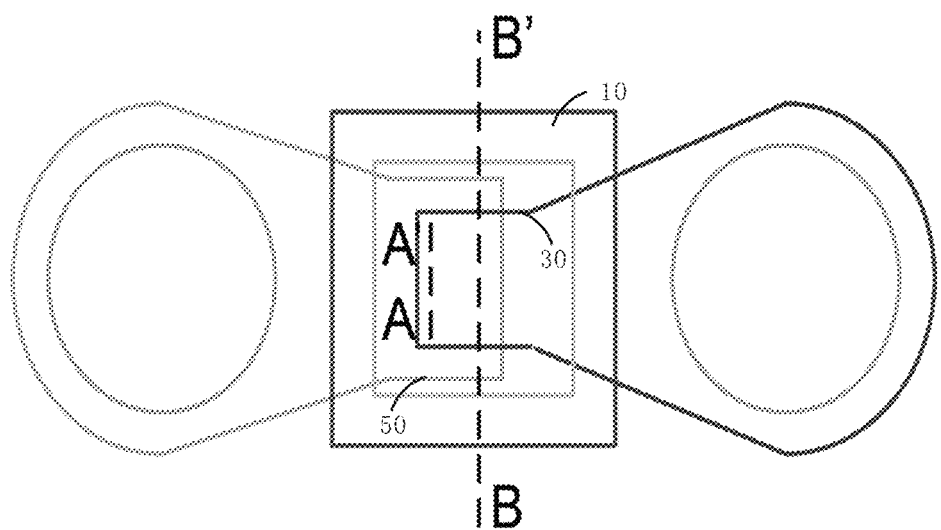
FIG. 2 is a schematic diagram of a top structure of a resonator according to an embodiment.

Specifically, a top view of the resonator according to this embodiment is shown in FIG. 2. The stacked structure shown in FIG. 1 is a schematic sectional view of the resonator shown in FIG. 2 at A-A'. In the structure shown in FIG. 2, metal connecting wires, that is, electrode lead-out wires, are led out at the bottom electrode layer 30 and the top electrode layer 50, and a window is provided on a passivation layer of the electrode lead-out wire to expose the electrode lead-out wire for electrical connection. The high and low acoustic impedance alternating layer 10 is a layered structure formed by alternately stacked high and low acoustic impedance layers. The selection of the high acoustic impedance layer and the low acoustic impedance layer is not unique, provided that acoustic impedance of the high acoustic impedance layer is higher than that of the low acoustic impedance layer. The resonator according to this embodiment is divided into two parts: a top stack and a bottom stack. The top stack is composed of two electrode layers (i.e., the bottom electrode layer 30 and the top electrode layer 50), two temperature coefficient of frequency compensation layers (i.e., the bottom temperature coefficient of frequency compensation layer 20 and the top temperature coefficient of frequency compensation layer 60) and a piezoelectric layer 40 sandwiched between the top electrode layer 50 and the bottom electrode layer 30. The bottom stack is mainly composed of the high and low acoustic impedance alternating layer 10. The top stack is arranged on the top of the bottom stack, while the bottom stack is arranged on the substrate 101, so that the entire stack of the resonator stack structure according to this embodiment is formed on the top of the substrate 101.

It is to be noted that the substrate 101 may be a wafer substrate 101 made of any material. In a more detailed embodiment, in order to present high acoustic impedance, the wafer substrate 101 may be specifically made of any one of silicon, silicon carbide, sapphire, lithium niobate, lithium tantalate, glass, quartz, aluminum nitride and diamond or any combinations thereof.

A phase length refers to phase movement of a sound wave when it propagates through a medium of a certain thickness, and its size is a ratio of an absolute thickness of the medium to a phase velocity of the sound wave. Therefore, the size of the phase length may also directly represent the thickness of the medium. In one embodiment, a total phase length of the top stack should be greater than half a period of an excited vibration mode, i.e., $t_p > \pi$, so that the device can operate on a harmonic wave of the fundamental mode. For example, in one embodiment, taking a $3^{rd}$ mode as an example, in the case of a $3^{rd}$ order overtone, the total thickness of the top stack may be set to $2\pi$, that is, $t_p = 2\pi$.

Types of the bottom temperature coefficient of frequency compensation layer 20 and the top temperature coefficient of frequency compensation layer 60 are not unique. In one embodiment, the bottom temperature coefficient of frequency compensation layer 20 and the top temperature coefficient of frequency compensation layer 60 may be film layers formed by any one of silicon dioxide, silicon monoxide, tellurium oxide, spin-on glass and silicon oxi carbide (SiOC), or film layers with dopants/impurities added to silicon dioxide, silicon monoxide, tellurium oxide, spin-on glass or silicon oxi carbide (SiOC). In other embodiments, film layers of other material types may also be used, provided that their temperature coefficient is opposite to that of the piezoelectric layer 40.

Similarly, specific types of the bottom electrode layer 30, the top electrode layer 50 and the piezoelectric layer 40 according to this embodiment are not unique. In different embodiments, different types of material layers may be used as the bottom electrode layer 30, the top electrode layer 50 or the piezoelectric layer 40 for different requirements. For example, in one embodiment, the bottom electrode layer 30 and the top electrode layer 50 may be made of any one of Al, Ru, Mo, W, Ti, Ta, Pt and Au or alloy materials formed by Al, Ru, Mo, W, Ti, Ta, Pt and Au. The piezoelectric layer 40 may be made of any one of or doped versions of aluminum nitride, lithium niobate, lithium tantalate, quartz, zinc oxide and lead zirconate titanate.

Figure 3:
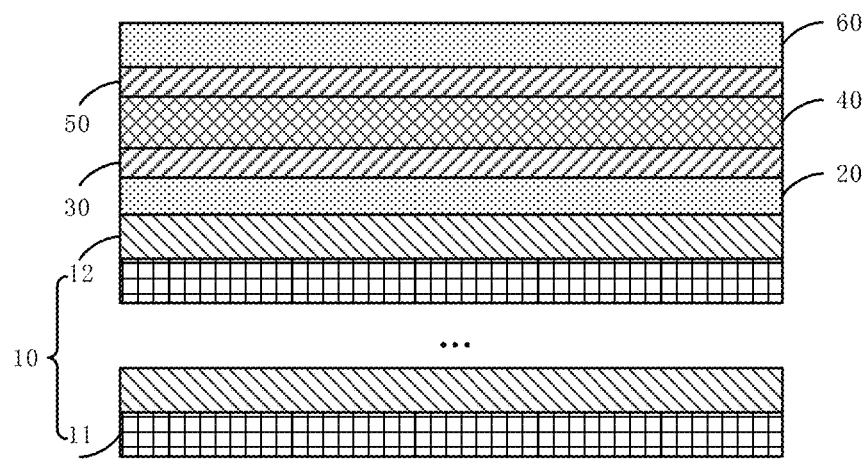
FIG. 3 is a schematic diagram of a sectional structure of a resonator according to another embodiment.

Referring to FIG. 3, in one embodiment, the high and low acoustic impedance alternating layer 10 includes a high acoustic impedance layer 12 and a low acoustic impedance layer 11. Acoustic impedance of the high acoustic impedance layer 12 is higher than that of the low acoustic impedance layer 11. The high acoustic impedance layer 12 and the low acoustic impedance layer 11 are stacked alternately. A layer in contact with the substrate 101 in the high and low acoustic impedance alternating layer 10 is a low acoustic impedance layer 11, and a layer in contact with the bottom temperature coefficient of frequency compensation layer 20 in the high and low acoustic impedance alternating layer 10 is the high acoustic impedance layer 12.

Specifically, the number of layers included in the high and low acoustic impedance alternating layer 10 is not unique. In a simpler embodiment, the high and low acoustic impedance alternating layer 10 may be designed with only one high acoustic impedance layer 12 and one low acoustic impedance layer 11. The high acoustic impedance layer 12 is located on the top of the low acoustic impedance layer 11. In other embodiments, more high acoustic impedance layers 12 and more low acoustic impedance layers 11 may be provided in combination with actual usage scenarios and user requirements, provided that the high acoustic impedance layers 12 and the low acoustic impedance layers 11 are sequentially arranged alternately, the layer in contact with the bottom temperature coefficient of frequency compensation layer 20 is the high acoustic impedance layer 12, and the layer in contact with the substrate 101 is the low acoustic impedance layer 11.

In one embodiment, thicknesses of the high acoustic impedance layer 12 and the low acoustic impedance layer 11 are not exactly the same.

Specifically, in this embodiment, in a case where a plurality of high acoustic impedance layers 12 and a plurality of low acoustic impedance layers 11 are provided, in order to ensure appropriate reflection of longitudinal and shear vibration generated in the piezoelectric layer 40, thicknesses of the high acoustic impedance layer 12 and the low acoustic impedance layer 11 in the high and low acoustic impedance alternating layer 10 are required to be optimized. That is, the high acoustic impedance layer 12 and the low acoustic impedance layer 11 with different thicknesses are designed according to an actual requirement.

Figure 4:
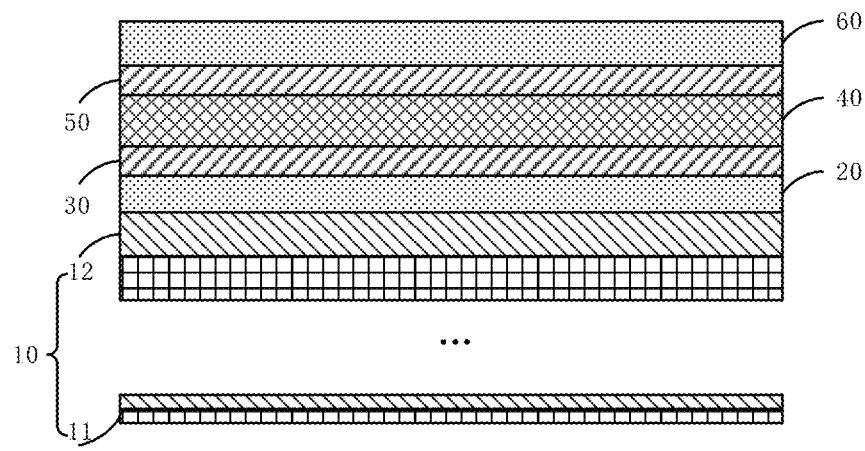
FIG. 4 is a schematic diagram of a sectional structure of a resonator according to yet another embodiment.

Referring to FIG. 4, in a more detailed embodiment, the closer the high acoustic impedance layer 12 is to the piezoelectric layer 40, the greater its thickness is; similarly, the closer the low acoustic impedance layer 11 is to the piezoelectric layer 40, the greater its thickness is. That is, $tLI_{2i}<tLI_{2i-2}<\ldots<tLI_2$, and $tHI_{2i-1}<tHI_{2i-3}<\ldots<tHI_1$, where $tLI_{2i}$ denotes a thickness of the bottom-most low acoustic impedance layer, $tLI_2$ denotes a thickness of the top-most low acoustic impedance layer, $tHI_{2i-1}$ denotes a thickness of the bottom-most high acoustic impedance layer, and $tHI_1$ denotes a thickness of the top-most high acoustic impedance layer.

In this embodiment, thicknesses of the high acoustic impedance layer 12 and the low acoustic impedance layer 11 are not exactly the same, which may provide more complete reflection and reduce design sensitivity to process inhomogeneity. That is, if the design is X, a small deviation may occur during the manufacturing, resulting in different thicknesses of the acoustic impedance layers, thereby providing a better yield.

It may be understood that, referring to FIG. 3, in other embodiments, the thicknesses of the high acoustic impedance layer(s) 12 and the low acoustic impedance layer(s) 11 may also be the same. For example, in a more detailed embodiment, an acoustic thickness of each layer in the high and low acoustic impedance alternating layer 10 may be designed to be one quarter of a period of an excited vibration mode. That is, the acoustic thickness of each layer is equal to the phase length $t_p$, and is $\pi/2$. It is to be noted that, in other embodiments, acoustic thicknesses of the high and low acoustic impedance layers may also be designed to other sizes according to actual usage scenarios and user requirements.

Figure 5:
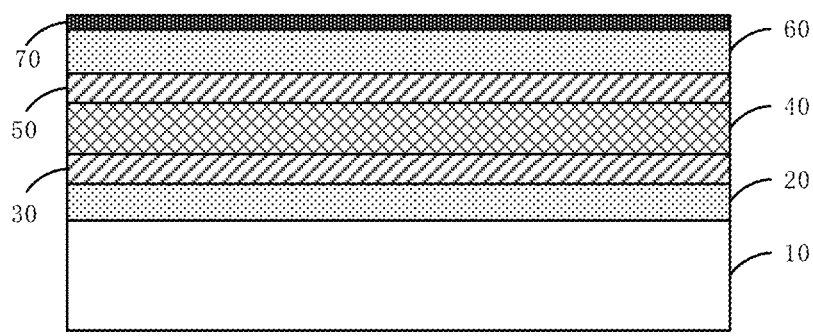
FIG. 5 is a schematic diagram of a sectional structure of a resonator according to still another embodiment.

Referring to FIG. 5, in one embodiment, the resonator further includes an additional layer 70. The additional layer 70 is arranged on a first surface of the top temperature coefficient of frequency compensation layer 60, a surface of the top temperature coefficient of frequency compensation layer 60 in contact with the top electrode layer 50 is a second surface of the top temperature coefficient of frequency compensation layer 60, and the first surface of the top temperature coefficient of frequency compensation layer 60 is arranged opposite to the second surface of the top temperature coefficient of frequency compensation layer 60.

It is to be noted that the type of the additional layer 70 is not unique. In one embodiment, the additional layer may be a film layer formed by any one or any combination of Pt, Mo, Au, AlN, SiN, SiO$_2$, Ti, W and Ru.

Figure 6:
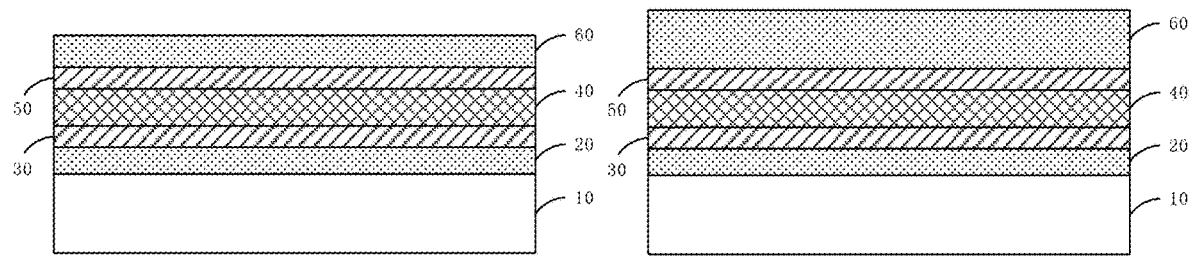
FIG. 6 is a schematic diagram of comparison between resonators with different resonant frequencies according to an embodiment.

Further, referring to FIG. 6, in one embodiment, the resonant frequency of the resonator may also be changed by changing the thickness of the top temperature coefficient of frequency compensation layer 60. That is, the thickness of the top temperature coefficient of frequency compensation layer 60 is not unique, which may be specifically designed differently according to user requirements and usage scenarios during actual manufacturing. The resonators with different resonant frequencies are different only in the thickness of the top temperature coefficient of frequency compensation layer 60. Therefore, during actual manufacturing, devices with different resonant frequencies may be manufactured adjacent to each other on a same wafer, thereby achieving higher manufacturing efficiency.

In another embodiment, different from the above embodiment in which the resonant frequency of the resonator is changed by changing the thickness of the top temperature coefficient of frequency compensation layer 60, in this embodiment, during actual manufacturing, the thicknesses of the top temperature coefficient of frequency compensation layers 60 of various resonators are set to be the same. When devices with different resonant frequencies (specifically, lower resonant frequencies) are required, processing may be directly performed on an original stack structure, and the resonant frequency of the acoustic device (i.e., the resonator) is changed by patterning the thinner additional layer 70 directly on the top of the top temperature coefficient of frequency compensation layer 60.

Figure 7:
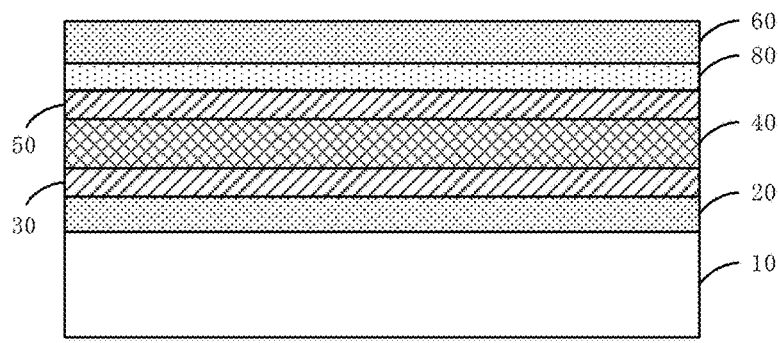
FIG. 7 is a schematic diagram of a sectional structure of a resonator according to yet another embodiment.

Referring to FIG. 7, in one embodiment, the resonator further includes a metal layer 80, the metal layer 80 is arranged on a first surface of the top electrode layer 50, the top temperature coefficient of frequency compensation layer 60 is arranged on a first surface of the metal layer 80, a surface of the metal layer 80 in contact with the top electrode layer 50 is a second surface of the metal layer 80, and the first surface of the metal layer 80 is arranged opposite to the second surface of the metal layer 80.

Specifically, in this embodiment, a metal layer 80 is further arranged between the top temperature coefficient of frequency compensation layer 60 and the top electrode layer 50 to change the resonant frequency of the resonator. It may be understood that the type of the metal layer 80 is not unique. In one embodiment, the metal layer may be made of a same material as the top electrode layer 50. In this case, during the fabricating process, it is only necessary to design the thickness of the top electrode layer 50 of the resonator to be greater than the thickness of the top electrode layer 50 of other resonators. In another embodiment, the metal layer 80 may also be made of a different material from the top electrode layer 50. In this case, after the top electrode layer 50 is formed, a thinner metal layer 80 is formed continuously using other metal materials in a resonator where the resonant frequency is required to be changed.

Figure 8:
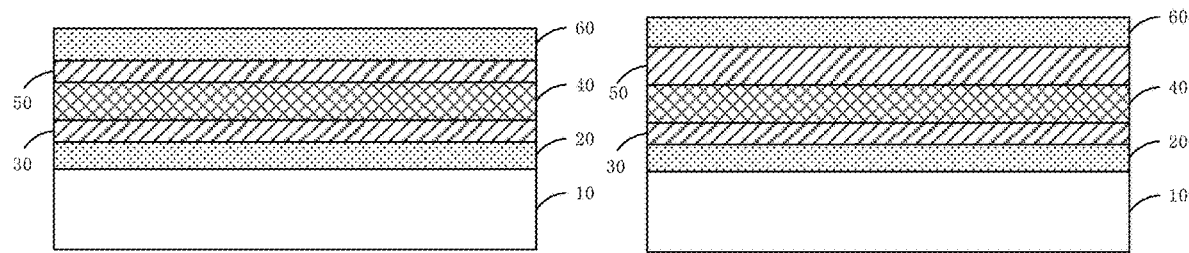
FIG. 8 is a schematic diagram of comparison between resonators with different resonant frequencies according to an embodiment.

It is to be noted that, referring to FIG. 8, in another embodiment, the resonant frequency of the resonator may also be changed by etching the top electrode layer 50. That is, in this embodiment, a plurality of resonators are processed simultaneously during the manufacturing process. After the processing of the top electrode layers 50 is completed collectively, for the resonator where the resonant frequency is required to be changed, only one etching process is required to be added to reduce the thickness of the top electrode layer 50. To obtain a certain resonant frequency, multiple etches or trimming steps may be performed on the top electrode layers 50.

Further, in one embodiment, in different resonators, the bottom electrode layers 30 and/or the top electrode layers 50 may also be formed by different metal materials. Resonators with different resonant frequencies can also be formed by changing material types of the one or two electrodes. Further, resonators with different resonant frequencies can also be formed by changing thicknesses of the one or two electrodes. That is, a thickness of one metal layer of a resonator may be different from that of another metal layer of the resonator.

In one embodiment, projections of the bottom electrode layer 30 and the top electrode layer 50 in a direction perpendicular to the substrate 101 are all polygons.

Figure 9:
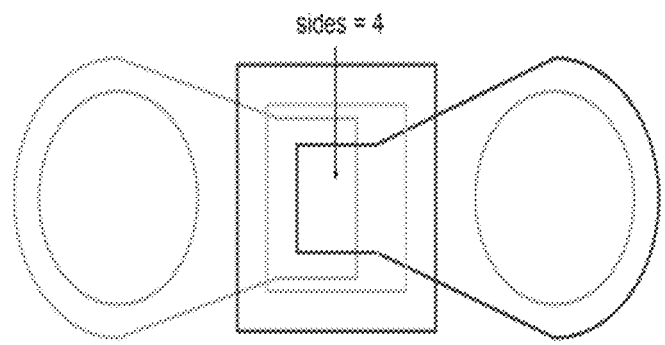
FIG. 9 is a schematic structural diagram of a quadrilateral electrode resonator according to an embodiment.
Figure 10:
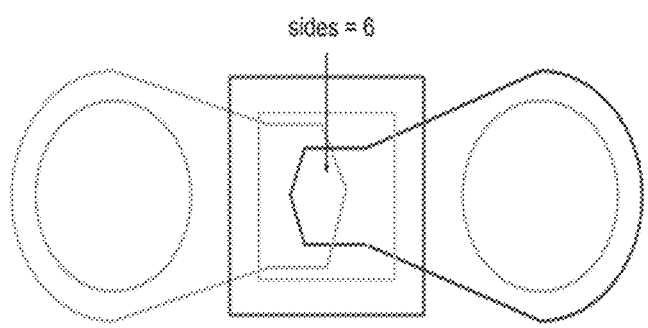
FIG. 10 is a schematic structural diagram of a hexagonal electrode resonator according to an embodiment.

Specifically, referring to FIG. 9 to FIG. 10, FIG. 9 shows a situation where the projections of the bottom electrode layer 30 and the top electrode layer 50 in the direction perpendicular to the substrate 101 are all quadrilaterals, and FIG. 10 shows a situation where the projections of the bottom electrode layer 30 and the top electrode layer 50 in the direction perpendicular to the substrate 101 are all hexagons. In this embodiment, the projections of the bottom electrode layer 30 and the top electrode layer 50 in the direction perpendicular to the substrate 101 are all polygons, for example, other polygons with a plurality of sides such as squares, rectangles or trapezoids. That is, in this case, the bottom electrode layer 30 and the top electrode layer 50 are of polygon prism structures. Heights of the polygon prisms are the thicknesses of the bottom electrode layer 30 and the top electrode layer 50. It may be understood that the polygons in this embodiment may be quadrilaterals, pentagons, hexagons, etc., and the number of sides of the polygon may range from 4 to infinity to form a structure that resembles a circle or an oval.

In one embodiment, the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 have a same length in a same direction parallel to the substrate 101.

Specifically, directions parallel to the substrate 101 are not unique, which may be lengths, widths or diagonals of patterns of projections of the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 in the direction perpendicular to the substrate 101. In one embodiment, for example, the patterns of the projections of the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 in the direction perpendicular to the substrate 101 are all rectangles, and the same directions parallel to the substrate 101 are widths of the rectangles. In this case, lengths of the resonator along width directions of the rectangles are the same. Corresponding sectional patterns along the width directions are shown in FIG. 1 or FIG. 3 and FIG. 4.

It may be understood that the lengths of the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 in the direction parallel to the substrate 101 are not designed in a unique manner. In one embodiment, the lengths of the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 in the same direction parallel to the substrate 101 are not exactly the same.

Figure 11:
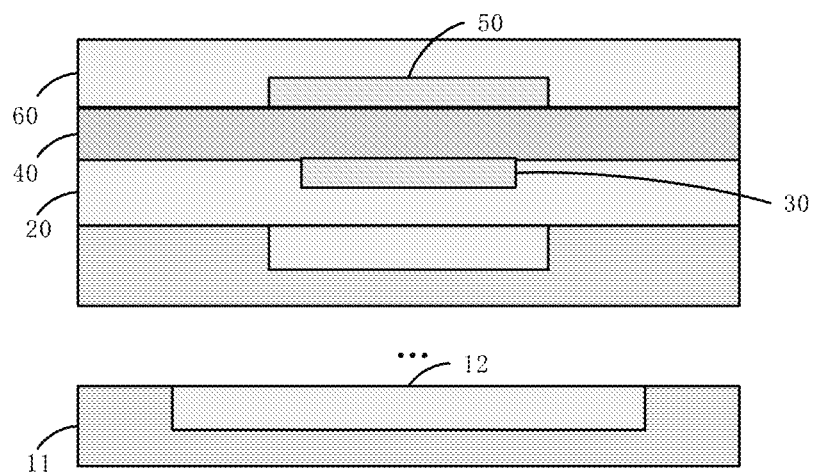
FIG. 11 is a schematic diagram of a sectional structure of a resonator according to yet another embodiment.
Figure 12:
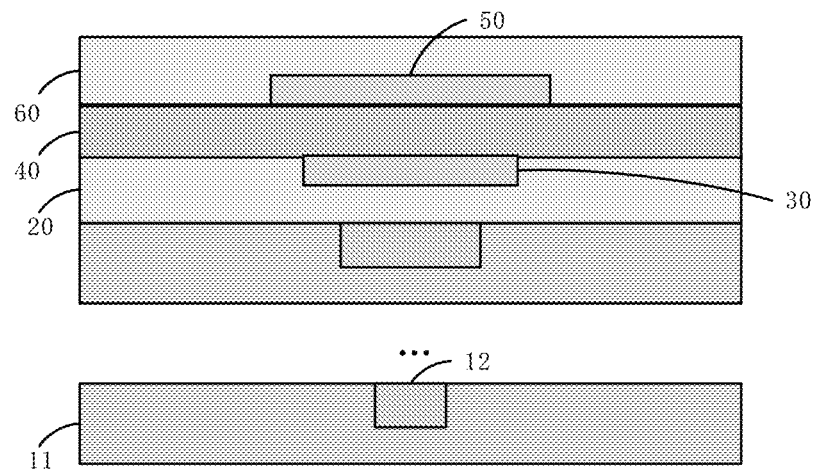
FIG. 12 is a schematic diagram of a sectional structure of a resonator according to still another embodiment.

Specifically, referring to FIG. 11 or FIG. 12, since the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 are sequentially stacked, when each layer is not of a same size, in order to prevent a gap between the stacked layers, in a lower layer with a larger width and an upper layer with a smaller width, the lower layer may be designed in a form of wrapping the upper stack, or in an upper layer with a larger width and a lower layer with a smaller width, the upper layer may be designed in a form of wrapping the lower stack. In this case, the top view corresponding to the resonator can be referred to in conjunction with FIG. 2. A sectional pattern of the resonator in a direction AA' may be similar to that of each layer in a same direction parallel to the substrate 101 in the above embodiment, referring to in conjunction with FIG. 1 or FIG. 3 to FIG. 8. A sectional pattern in a direction BB' is shown in FIG. 11 or FIG. 12. A layer with a larger size may wrap a layer with a smaller size. Widths between the bottom electrode layer and the high acoustic impedance layers may increase or decrease sequentially from top to bottom, or the widths may be irregularly arranged, provided that widths of the stacks in a same direction parallel to the substrate 101 are not exactly the same.

Figure 13:
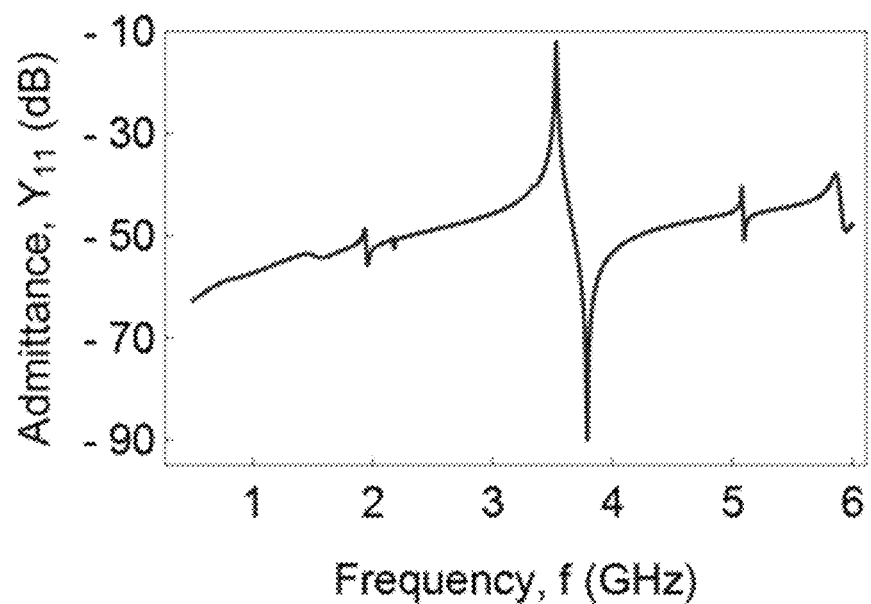
FIG. 13 is a schematic response diagram of admittance vs. frequency of a resonator according to an embodiment.
Figure 14:
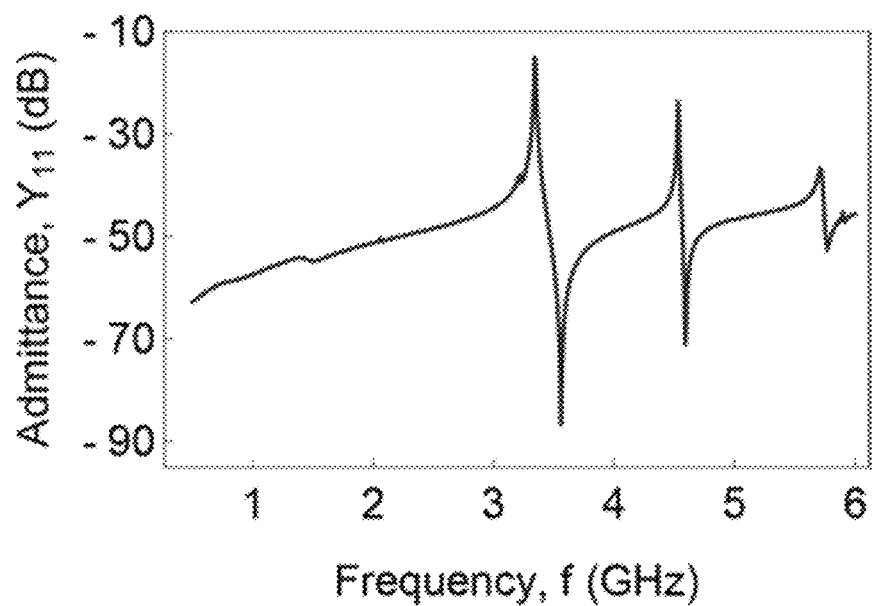
FIG. 14 is a schematic response diagram of admittance vs. frequency of a resonator according to another embodiment.
Figure 15:
FIG. 15 is a schematic diagram of stress distribution of a resonator according to an embodiment.

Referring to in conjunction with FIG. 13 to FIG. 15, FIG. 13 and FIG. 14 show simulated responses of characteristic admittance of the resonator according to the present application at different frequencies respectively. An optimal thickness of stacked reflective layers is obtained at a resonant frequency of about 3.5 GHz by eigenfrequency simulation. FIG. 15 is a schematic diagram of stress distribution of the resonator according to the present application, from which distribution of the resonator from minimum stress −Max to maximum stress +Max may be obtained.

According to the resonator mentioned above, the high and low acoustic impedance alternating layer 10, the bottom temperature coefficient of frequency compensation layer 20, the bottom electrode layer 30, the piezoelectric layer 40, the top electrode layer 50 and the top temperature coefficient of frequency compensation layer 60 are sequentially stacked on the substrate 101 by using a specific microfabrication process, to form a new resonator. The resonator can simultaneously show excellent characteristics of low loss, wide bandwidth, low temperature sensitivity and a small size through the special stack geometry, thereby having better operation reliability.

An electronic device, including the resonator described above.

Specifically, a specific structure of the resonator in the electronic device of this embodiment is shown in the above embodiments and the accompanying drawings, including: a high and low acoustic impedance alternating layer 10, a bottom temperature coefficient of frequency compensation layer 20, a bottom electrode layer 30, a piezoelectric layer 40, a top electrode layer 50 and a top temperature coefficient of frequency compensation layer 60. The high and low acoustic impedance alternating layer 10 is arranged on a substrate 101; the bottom temperature coefficient of frequency compensation layer 20 is arranged on a first surface of the high and low acoustic impedance alternating layer 10, a surface of the high and low acoustic impedance alternating layer 10 in contact with the substrate 101 is a second surface of the high and low acoustic impedance alternating layer 10, and the first surface of the high and low acoustic impedance alternating layer 10 is arranged opposite to the second surface of the high and low acoustic impedance alternating layer 10; the bottom electrode layer 30 is arranged on a first surface of the bottom temperature coefficient of frequency compensation layer 20, a surface of the bottom temperature coefficient of frequency compensation layer 20 in contact with the high and low acoustic impedance alternating layer 10 is a second surface of the bottom temperature coefficient of frequency compensation layer 20, and the first surface of the bottom temperature coefficient of frequency compensation layer 20 is arranged opposite to the second surface of the bottom temperature coefficient of frequency compensation layer 20; the piezoelectric layer 40 is arranged on a first surface of the bottom electrode layer 30, a surface of the bottom electrode layer 30 in contact with the bottom temperature coefficient of frequency compensation layer 20 is a second surface of the bottom electrode layer 30, and the first surface of the bottom electrode layer 30 is arranged opposite to the second surface of the bottom electrode layer 30; the top electrode layer 50 is arranged on a first surface of the piezoelectric layer 40, a surface of the piezoelectric layer 40 in contact with the bottom electrode layer 30 is a second surface of the piezoelectric layer 40, and the first surface of the piezoelectric layer 40 is arranged opposite to the second surface of the piezoelectric layer 40; and the top temperature coefficient of frequency compensation layer 60 is arranged on a first surface of the top electrode layer 50, a surface of the top electrode layer 50 in contact with the piezoelectric layer 40 is a second surface of the top electrode layer 50, and the first surface of the top electrode layer 50 is arranged opposite to the second surface of the top electrode layer 50.

The resonator can simultaneously show excellent characteristics of low loss, wide bandwidth, low temperature sensitivity and a small size through the special stack geometry, thereby having better operation reliability. When applied to the electronic device, the resonator may effectively improve usage reliability of the electronic device, so that the electronic device can meet the requirements of the 5G standard.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present application, and their description is specific and detailed, but cannot therefore be understood as a limitation on the patent scope of the application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A resonator, comprising:
   a high and low acoustic impedance alternating layer arranged on a substrate;
   a bottom temperature coefficient of frequency compensation layer arranged on a first surface of the high and low acoustic impedance alternating layer, a surface of the high and low acoustic impedance alternating layer in contact with the substrate being a second surface of the high and low acoustic impedance alternating layer, the first surface of the high and low acoustic impedance alternating layer being arranged opposite to the second surface of the high and low acoustic impedance alternating layer;
   a bottom electrode layer arranged on a first surface of the bottom temperature coefficient of frequency compensation layer, a surface of the bottom temperature coefficient of frequency compensation layer in contact with the high and low acoustic impedance alternating layer being a second surface of the bottom temperature coefficient of frequency compensation layer, the first surface of the bottom temperature coefficient of frequency compensation layer being arranged opposite to the second surface of the bottom temperature coefficient of frequency compensation layer;
   a piezoelectric layer arranged on a first surface of the bottom electrode layer, a surface of the bottom electrode layer in contact with the bottom temperature coefficient of frequency compensation layer being a second surface of the bottom electrode layer, the first surface of the bottom electrode layer being arranged opposite to the second surface of the bottom electrode layer;
   a top electrode layer arranged on a first surface of the piezoelectric layer, a surface of the piezoelectric layer in contact with the bottom electrode layer being a second surface of the piezoelectric layer, the first surface of the piezoelectric layer being arranged opposite to the second surface of the piezoelectric layer;
   a metal layer arranged on a first surface of the top electrode layer, wherein
     a surface of the top electrode layer in contact with the piezoelectric layer being a second surface of the top electrode layer, and
     the first surface of the top electrode layer being arranged opposite to the second surface of the top electrode layer; and
   a top temperature coefficient of frequency compensation layer arranged on a first surface of the metal layer, wherein
     a surface of the metal layer in contact with the top electrode layer is a second surface of the metal layer, and
     the first surface of the metal layer is arranged opposite to the second surface of the metal layer, and
     the metal layer is made of a different material as the top electrode layer to change resonant frequency of the resonator.

2. The resonator according to claim 1, wherein the high and low acoustic impedance alternating layer comprises a high acoustic impedance layer and a low acoustic impedance layer, acoustic impedance of the high acoustic impedance layer is higher than that of the low acoustic impedance layer, the high acoustic impedance layer and the low acoustic impedance layer are stacked alternately, a layer in contact with the substrate in the high and low acoustic impedance alternating layer is the low acoustic impedance layer, and a layer in contact with the bottom temperature coefficient of frequency compensation layer in the high and low acoustic impedance alternating layer is the high acoustic impedance layer.

3. The resonator according to claim 2, wherein thicknesses of the high acoustic impedance layer and the low acoustic impedance layer are not exactly same.

4. The resonator according to claim 2, wherein thicknesses of the high acoustic impedance layer and the low acoustic impedance layer are same.

5. The resonator according to claim 1, further comprising an additional layer, wherein the additional layer is arranged on a first surface of the top temperature coefficient of frequency compensation layer, a surface of the top temperature coefficient of frequency compensation layer in contact with the top electrode layer is a second surface of the top temperature coefficient of frequency compensation layer, and the first surface of the top temperature coefficient of frequency compensation layer is arranged opposite to the second surface of the top temperature coefficient of frequency compensation layer.

6. The resonator according to claim 1, wherein projections of the bottom electrode layer and the top electrode layer in a direction perpendicular to the substrate are all polygons.

7. The resonator according to claim 1, wherein the high and low acoustic impedance alternating layer, the bottom temperature coefficient of frequency compensation layer, the bottom electrode layer, the piezoelectric layer, the top electrode layer and the top temperature coefficient of frequency compensation layer have a same length in a same direction parallel to the substrate.

8. The resonator according to claim 1, wherein the high and low acoustic impedance alternating layer, the bottom temperature coefficient of frequency compensation layer, the bottom electrode layer, the piezoelectric layer, the top electrode layer and the top temperature coefficient of frequency compensation layer are not exactly the same in length in a same direction parallel to the substrate.

9. The resonator according to claim 1, wherein a total phase length of a top stack formed by the bottom temperature coefficient of frequency compensation layer, the bottom electrode layer, the piezoelectric layer, the top electrode layer and the top temperature coefficient of frequency compensation layer is greater than half a period of an excited vibration mode.

10. The resonator according to claim 1, wherein each of the bottom temperature coefficient of frequency compensation layer and the top temperature coefficient of frequency compensation layer has a temperature coefficient opposite to a temperature coefficient of the piezoelectric layer.

11. The resonator according to claim 2, wherein an acoustic thickness of each layer in the high and low acoustic impedance alternating layer is equal to one quarter of a period of an excited vibration mode.

12. The resonator according to claim 5, wherein the additional layer is a film layer formed by any one or any combination of Pt, Mo, Au, AlN, SiN, $SiO_2$, Ti, W and Ru.

13. An electronic device, comprising the resonator according to claim 1.

14. The resonator according to claim 2, wherein
the high and low acoustic impedance alternating layer comprises a plurality of high acoustic impedance layers and a plurality of low acoustic impedance layers, and
the closer the high acoustic impedance layer is to the piezoelectric layer, the greater its thickness is, and the closer the low acoustic impedance layer is to the piezoelectric layer, the greater its thickness is.

15. The resonator according to claim 1, wherein the resonant frequency of the resonator is further changed by changing a thickness of the top temperature coefficient of frequency compensation layer.

16. The resonator according to claim 5, wherein the resonant frequency of the resonator is further changed by patterning the additional layer directly on top of the top temperature coefficient of frequency compensation layer.

17. The resonator according to claim 1, wherein the resonant frequency of the resonator is further changed by etching the top electrode layer.

* * * * *